United States Patent [19]

Ohta

[11] Patent Number: 4,982,191

[45] Date of Patent: Jan. 1, 1991

[54] CLAMPING APPARATUS AND GAIN CONTROL APPARATUS

[75] Inventor: Haruo Ohta, Yawata, Japan

[73] Assignee: Matsushita Electric Industrial Co., Ltd., Kadoma, Japan

[21] Appl. No.: 497,253

[22] Filed: Mar. 22, 1990

[30] Foreign Application Priority Data

Mar. 24, 1989 [JP] Japan .................................. 1-72412

[51] Int. Cl.⁵ .......................................... H03M 13/00
[52] U.S. Cl. .................................... 341/118; 341/155
[58] Field of Search ............... 341/118, 155, 163, 126, 341/131

[56] References Cited

U.S. PATENT DOCUMENTS

| | | | |
|---|---|---|---|
| 3,882,488 | 5/1975 | Kosakowski et al. | 341/131 |
| 4,584,558 | 4/1986 | Mascher et al. | 341/139 |
| 4,590,459 | 5/1986 | Lanz et al. | 341/127 |
| 4,903,023 | 2/1990 | Evans et al. | 341/155 X |

FOREIGN PATENT DOCUMENTS 60-16769 8/1985 Japan .
63-164767 8/1988 Japan .

*Primary Examiner*—William M. Shoop, Jr.
*Assistant Examiner*—Sharon D. Logan
*Attorney, Agent, or Firm*—Wenderoth, Lind & Ponack

[57] ABSTRACT

In converting an analog signal to a digital signal, a clamping apparatus is capable of adjusting the DC level of the analog signal to a predetermined value, and a gain control apparatus is capable of adjusting the amplitude of the analog signal to a predetermined value. Each of such clamping apparatus and gain control apparatus is adapted for use particularly in digitizing a video signal and comprises: a detection circuit for detecting the DC level or the amplitude of the signal digitized by an analog-digital converter; a signal conversion circuit for outputting, in accordance with the detection signal, a three-state signal indicative of a high voltage, a lower voltage or a high impedance; an integrator for integrating such three-state signal; and a feedback loop for controlling, by the integrated signal, the analog signal to be inputted to the analog-digital converter.

10 Claims, 5 Drawing Sheets

4,982,191

CLAMPING APPARATUS AND GAIN CONTROL APPARATUS

BACKGROUND OF THE INVENTION

1. Field of the Invention

The present invention relates to a clamping apparatus for adjusting the DC level of an analog signal to a predetermined value in analog-to-digital signal conversion, and also to a gain control apparatus for adjusting the amplitude of an analog signal to a predetermined value. Both apparatuses are adapted for use particularly in digitizing a video signal.

2. Description of the Prior Art

In broadcasting equipment as well as consumer-use audio and video equipment inclusive of television receivers and video tape recorders, it is generally usual of late to adopt the technique of converting an analog signal to a digital signal and thereby processing the signal in a digital form. When an analog signal is digitized, the DC level or the amplitude of such analog signal inputted to an analog-digital (A-D) converter needs to be adjusted to a predetermined value. For this purpose, it is customary to employ a clamping apparatus or a gain control apparatus with a feedback loop which detects the DC level or the amplitude of the signal digitized by means of an A-D converter and controls the analog signal inputted to the A-D converter.

In the conventional clamping apparatus contrived for processing a video signal, there are known some typical ones which will be described below.

An exemplary prior technique is disclosed in Japanese Patent Application Laid-open No. 63-16476 (1988) and U.S. Pat. No. 4,562,471, wherein the DC level of a digitized video signal is maintained at a predetermined value by first detecting the DC level error from such video signal, then integrating the error in the form of a digital signal to obtain a digital DC signal, subsequently converting such digital DC signal to an analog DC signal by means of a digital-analog (D-A) converter, and adding the converted signal to the analog video signal inputted to the A-D converter.

However, such conventional method has a disadvantage of necessitating a high precision D-A converter.

As for the clamping apparatus of another type where no D-A converter is required, a prior art example is disclosed in Japanese Patent Application Laid-open No. 60-16769 (1985), wherein the DC level of a signal is maintained at a predetermined value by first pulse-width modulating the digital DC signal obtained similarly to the above-described example, thereby producing a digital pulse signal of a duty ratio corresponding to the amplitude of the digital DC signal, then converting the modulated signal to an analog DC signal by means of an analog integrating circuit, and adding such converted signal to the analog video signal inputted to the A-D converter as in the foregoing example.

However, since the analog DC signal is obtained by pulse width modulation and analog integration in the above method, there exists a fault that undesired DC level variations based on the ripple are generated if a small time constant is selected for analog integration. To the contrary, if a great time constant is selected, the action of following up the DC level change in the signal is rendered slow to consequently bring about a failure in attaining a satisfactory clamping operation.

SUMMARY OF THE INVENTION

An object of the present invention is to provide a clamping apparatus which requires no D-A converter.

Another object of the present invention is to provide a clamping apparatus requiring no D-A converter and operable without causing any undesired DC level variation.

Still another object of the present invention is to provide a clamping apparatus requiring no D-A converter and capable of properly following up any DC level change in an input signal.

A further object of the present invention is to provide a gain control apparatus which requires no D-A converter.

A further another object of the present invention is to provide a gain control apparatus requiring no D-A converter and operable without causing any undesired amplitude variation.

And yet another object of the present invention is to provide a gain control apparatus requiring no D-A converter and capable of properly following up any amplitude change in an input signal.

For the purpose of achieving the objects mentioned, a clamping apparatus according to the present invention comprises: DC error control means for detecting a DC error from a digital signal and outputting a control signal indicative of the DC error; signal conversion means for outputting a high voltage, a low voltage or a high impedance in accordance with the control signal; integrating means for integrating the output of the signal conversion means; voltage adding means for adding a DC voltage to an input analog signal in accordance with an output of the integrating means; and analog-digital conversion means for converting an output of the voltage adding means to a digital signal, the digital signal from the analog-digital conversion means being fed to the DC error control means.

A gain control apparatus according to the present invention comprises: amplitude error control means for detecting an amplitude error from a digital signal and outputting a control signal indicative of the amplitude error; signal conversion means for outputting a high voltage, a low voltage or a high impedance in accordance with the control signal; integrating means for integrating the output of the signal conversion means; variable gain amplifying means for amplifying an input analog signal in accordance with an output of the integrating means; and analog-digital conversion means for converting an output of the variable gain amplifying means to a digital signal, the digital signal from the analog-digital conversion means being fed to the amplitude error control means.

It is to be understood that the present invention is not limited to the above objects or the following embodiments alone and may be applied also to other objects and constitutions within the scope defined in the appended claims.

DESCRIPTION OF THE PREFERRED EMBODIMENTS

Hereinafter an embodiment of the clamping apparatus of the present invention will be described with reference to the accompanying drawings.

Figure 1:
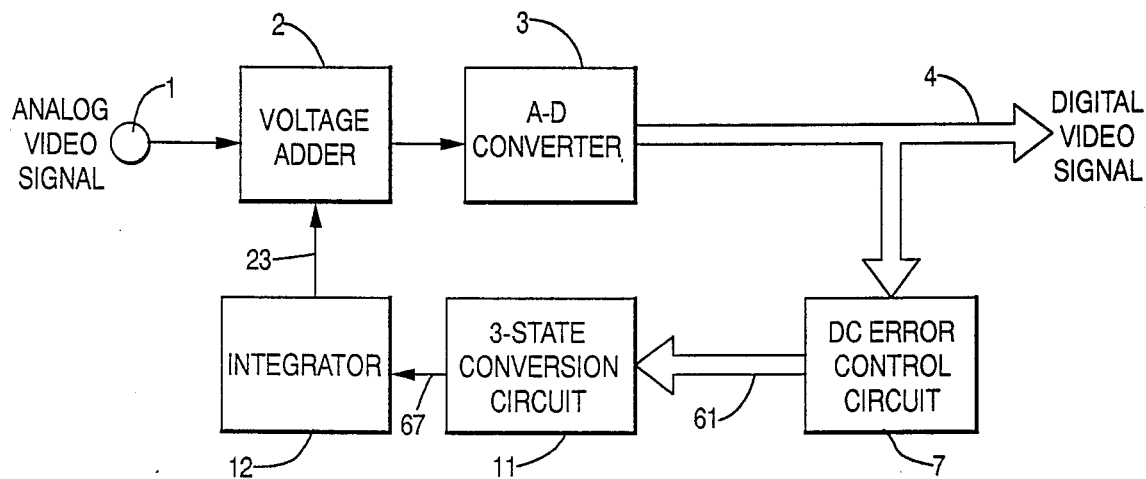
FIG. 1 is a block diagram of an exemplary clamping apparatus embodying the present invention.

FIG. 1 is a block diagram showing an exemplary embodiment of the clamping apparatus according to the present invention. In this diagram, an input analog video signal is fed via an input terminal 1. In a voltage adder 2, a voltage obtained from an integrator 12 is added to the input video signal. The output of the voltage adder 2 is then fed to an A-D converter 3 to be converted to a digital signal 4. The digital signal 4 thus obtained is inputted to a DC error control circuit 7.

Figure 2:
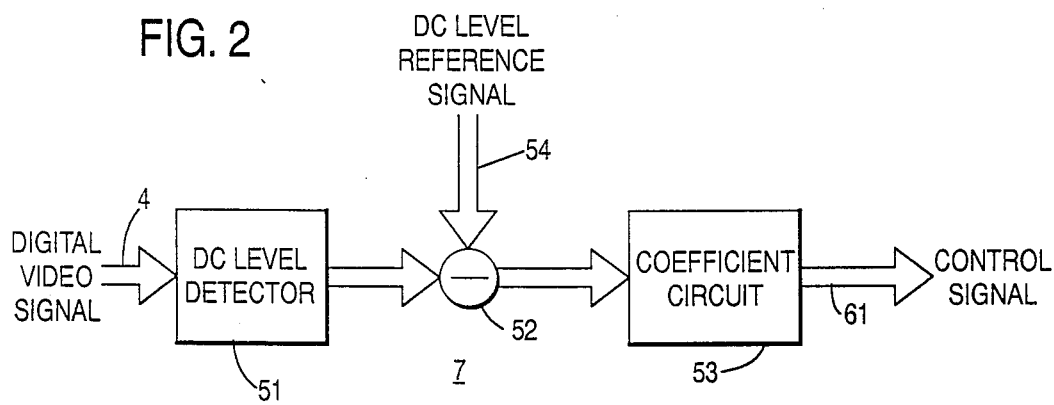
FIG. 2 is a block diagram of a DC error control circuit in the embodiment of the clamping apparatus according to the invention.

The DC error control circuit 7 is so constituted as shown in FIG. 2, wherein a DC level is detected by a DC level detector 51 from a synchronizing signal contained in the digital video signal 4. Subsequently the difference between the detected DC level and a DC level reference signal 54 representing a reference of the DC level is calculated by a subtractor 52 to become an error signal. The error signal thus obtained is then fed to a coefficient circuit 53, where the error signal is multiplied by a predetermined coefficient to become a control signal 61.

Referring to FIG. 1 again, the control signal 61 obtained in the DC error control circuit 7 is fed to a three-state conversion circuit 11.

Figure 3:
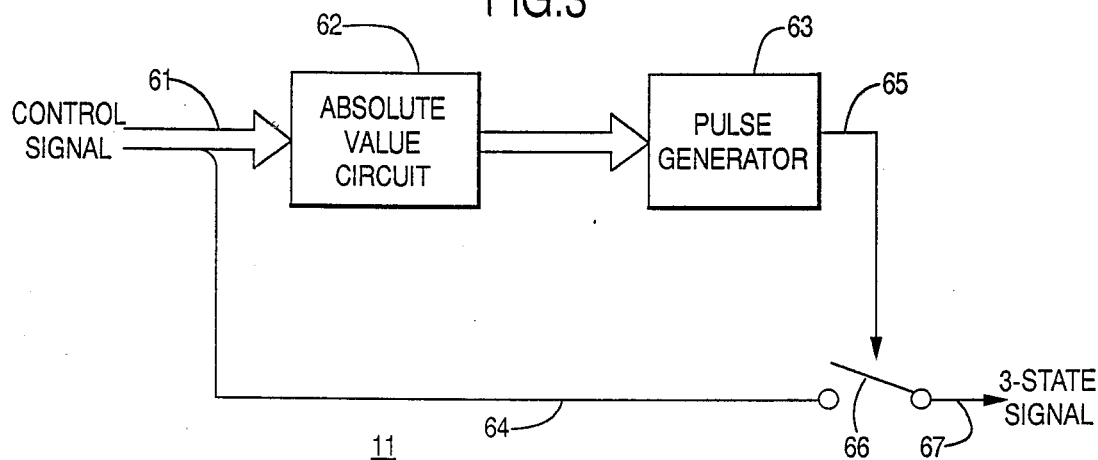
FIG. 3 is a block diagram of a three-state conversion circuit in the embodiment of the clamping apparatus according to the invention.

FIG. 3 shows a constitution of the three-state conversion circuit 11. The control signal 61 is fed to an absolute value circuit 62, which then extracts the absolute value of the control signal 61. A pulse generator 63 outputs a pulse signal 65 having a pulse width proportional to the absolute value. Meanwhile a sign bit 63 representing a positive or negative sign of the control signal 61 is introduced to a switch 66, which is so controlled as to be closed only during the presence of the pulse signal 65. As a result, a three-state signal 67 outputted from the switch 66 becomes a high voltage or a low voltage in accordance with the sign of the control signal 61 during a period proportional to the absolute value of the control signal 61. During any other period, the output of the switch 66 being opened becomes a high impedance.

Figure 4:
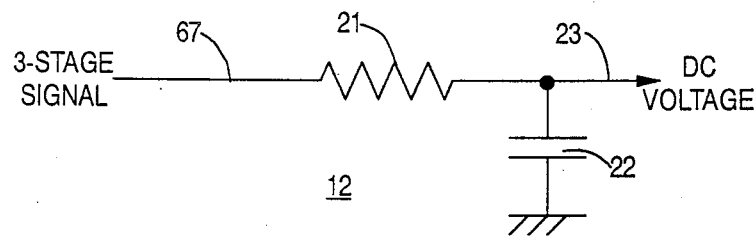
FIG. 4 illustrates an integrator in the embodiment of the clamping apparatus according to the invention.

Now a description will be continued with reference to FIG. 1 again. The three state signal 67 obtained from the three-state conversion circuit 11 as mentioned above is then inputted to the integrator 12. The integrator 12 may be comprised of a resistor 21 and a capacitor 22 as shown in FIG. 4 and produces an integrated output 23.

Therefore the integrated output 23 shown in FIG. 1 is equal to the integrated analog signal held after conversion of the value which is represented by the control signal 61 based on the DC error signal outputted from the DC error control circuit 7. Then the integrated output 23 is fed back to the voltage adder 2 so as to be added to the input analog signal.

Due to the constitution and the operation mentioned, the digital video signal obtained from the A-D converter 3 is so controlled that the DC level thereof is kept at a constant desired value.

Thus, according to the above-described embodiment, the control signal 61 based on the detected DC error signal is converted to a signal 67 having three states inclusive of a high impedance, and the signal 67 is processed by analog integration to become a signal 23, which is then used for controlling the voltage adder 2. Consequently, a high-precision clamping apparatus of a simplified circuit configuration can be realized without the necessity of a D-A converter.

In a balanced state, the three-state signal 67 is indicative of a high impedance, so that no ripple is generated in the integrated signal 23. Accordingly, there occurs none of undesired clamping level variations that may otherwise be induced by the ripple. Furthermore, due to the nonexistence of any ripple, a sufficient degree of freedom is ensured in setting the time constant of the integrator 2 to eventually achieve a satisfactory action of following up the DC level change in the input signal.

In addition, the three-state signal 67 has a pulse width proportional to the absolute value of the control signal 61, whereby the DC level is corrected at a speed corresponding to the amount of the DC level change in the input signal. Therefore it becomes possible to attain a fast and stable action of following up the DC level change in the input signal.

Figure 5:
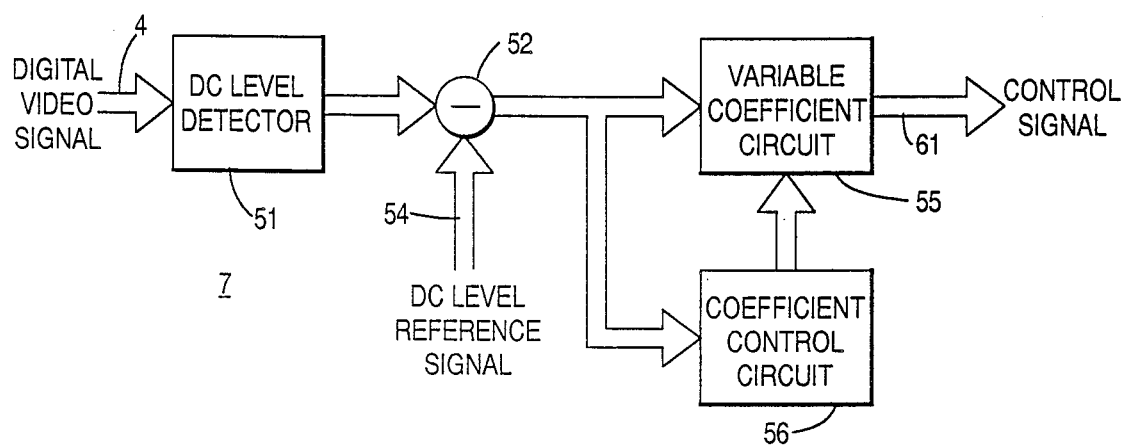
FIGS. 5, 6 and 7 are block diagrams of other exemplary DC error control circuits in the embodiment of the clamping apparatus according to the invention.

The DC error control circuit 7 having the constitution of FIG. 2 in the above embodiment may be so modified as shown in FIG. 5. In this modification, the coefficient used to multiply the error signal obtained from the subtractor 52 is changed by a variable coefficient circuit 55 in accordance with a control signal from a coefficient control circuit 56. For example, the coefficient is increased in the case of a great error or is decreased in the case of a small error. Thus, the control circuit 7 functions to reduce the DC error rapidly in response to any great change thereof caused at the time of switching the signal or turning on the power supply, or performs a stable operation regardless of noise and so forth in case the error is small.

Figure 6:
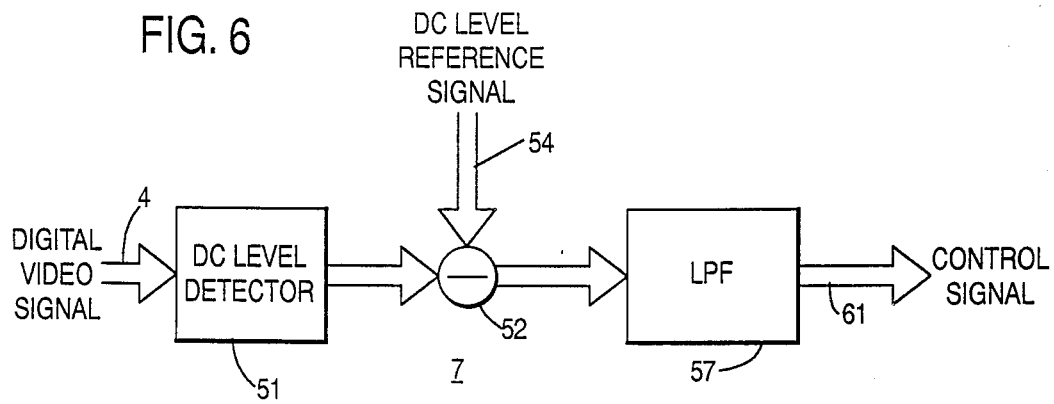

Besides the above, the DC error control circuit 7 may be so constituted as shown in FIG. 6. In this modified example, a low-pass filter (LPF) 57 is provided for passing therethrough the error signal obtained from the subtractor 52 and thereby producing a control signal 61. The provision of such a filter enhances the stability with respect to any noise and the transition characteristics at the time of switching the signal. If the low-pass filter 57 is so formed as to include a complete integral term, adequate compensation can be executed even in case the potential of the integrated output 23 is gradually lowered or raised because of some current leakage or the like in the integrator of FIG. 4, whereby a stable operation can be realized.

Figure 7:
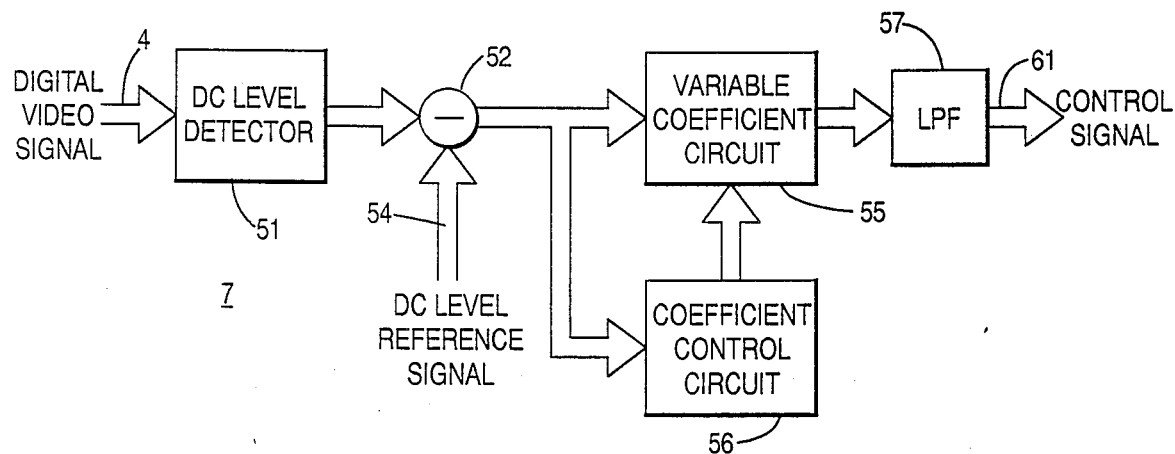

Furthermore, the DC error control circuit 7 may be so modified as shown in FIG. 7. In this modification, the combined features in the aforementioned examples of FIGS. 5 and 6 are attainable.

Hereinafter a description will be given with regard to a preferred embodiment of the gain control apparatus according to the present invention.

Figure 8:
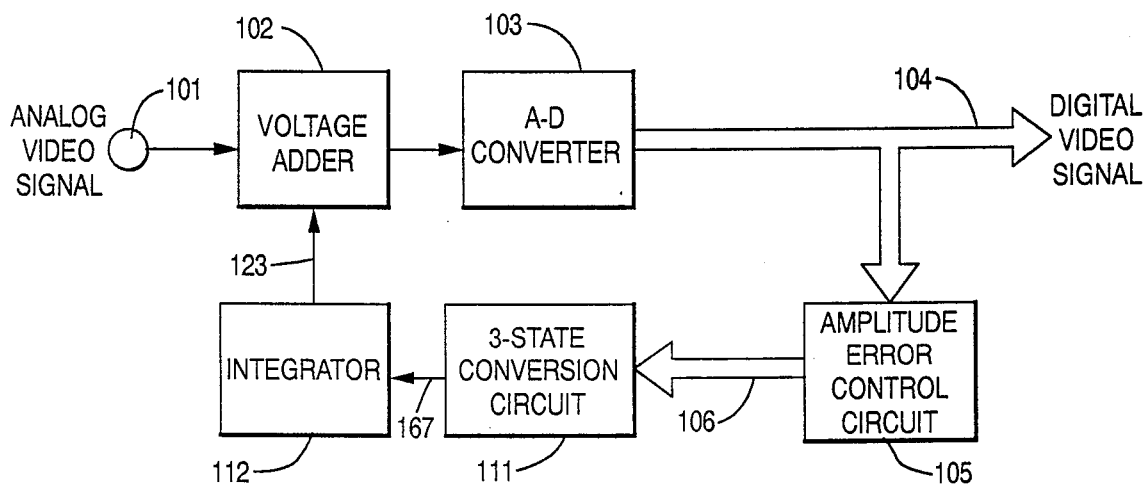
FIG. 8 is a block diagram of an exemplary gain control apparatus embodying the invention.

FIG. 8 is a block diagram of an exemplary gain control apparatus embodying the present invention. In this diagram, an input analog video signal is fed via an input terminal 101. The input signal is amplified in a variable gain amplifier 102 controlled by a voltage applied thereto from integrator 112, and then is fed to an A-D converter 103, where the amplified signal is converted to a digital signal 104. The digital signal 104 thus obtained is inputted to an amplitude error control circuit 105.

Figure 9:
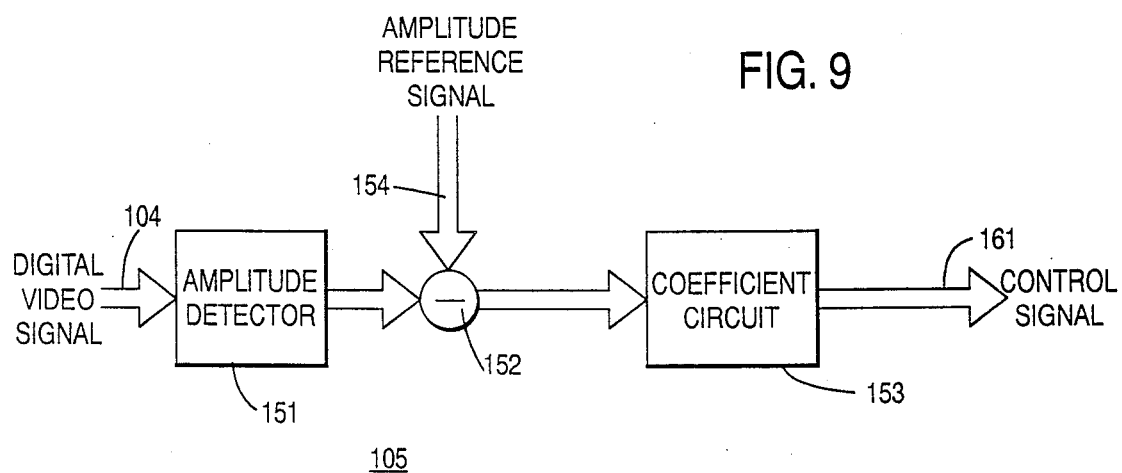
FIGS. 9 through 12 are block diagrams of exemplary amplitude error control circuits in the embodiment of the gain control apparatus according to the invention.

The amplitude error control circuit 105 is so constituted as shown in FIG. 9. First the signal amplitude is detected by an amplitude detector 151 from a synchronizing signal or the like contained in the digital video signal 104. Then the difference between the detected amplitude and an amplitude reference signal 154 representing a reference of the amplitude is calculated by a subtractor 152 to become an error signal. The error signal thus obtained is multiplied by a predetermined coefficient in a coefficient circuit 153 to become a control signal 161.

Referring to FIG. 8 again, the control signal 161 obtained in the amplitude error control circuit 105 is fed to a three-state conversion circuit 111. This circuit 111 has the same constitution as that of FIG. 3 shown in the aforementioned embodiment of the clamping apparatus. Therefore the three-state signal 167 becomes a high voltage or a low voltage in accordance with the sign of the control signal 161 during a period proportional to the absolute value of the control signal 161, or becomes a high impedance during any other period than the above. The three-state signal 167 is inputted to the integrator 112. This integrator 112 has the same constitution as that of FIG. 4 shown in the aforementioned embodiment of the-clamping apparatus. Therefore the integrated output 123 is equal to the integrated analog signal held after conversion of the value which is represented by the control signal 161 based on the amplitude error signal outputted from the amplitude error control circuit 105. Then the integrated output 123 is fed back to the variable gain amplifier 102 so as to control the gain.

Due to the constitution and the operation mentioned, the digital video signal obtained from the A-D converter 103 is so controlled that the amplitude thereof is kept at a constant desired value.

Thus, according to the above-described embodiment, the control signal 161 based on the detected error signal is converted to a signal 167 having three states inclusive of a high impedance, and the signal 167 is processed by analog integration to become a signal 123, which is then used for controlling the variable gain amplifier 102. Consequently, a high-precision gain control apparatus of a simplified circuit configuration can be realized without the necessity of a D-A converter.

In a balanced state, the three-state signal 167 is indicative of a high impedance, so that no ripple is generated in the integrated signal 123. Accordingly, there occurs none of undesired amplitude variations that may otherwise be induced by the ripple. Furthermore, due to the nonexistence of any ripple, a sufficient degree of freedom is ensured in setting the time constant of the integrator 112 to eventually achieve a satisfactory action of following up the amplitude change in the input signal.

In addition, the three-state signal 167 has a pulse width proportional to the absolute value of the control signal 161, whereby the gain is corrected at a speed corresponding to the amount of the amplitude change in the input signal. Therefore it becomes possible to attain a fast and stable action of following up the amplitude change in the input signal.

Figure 10:
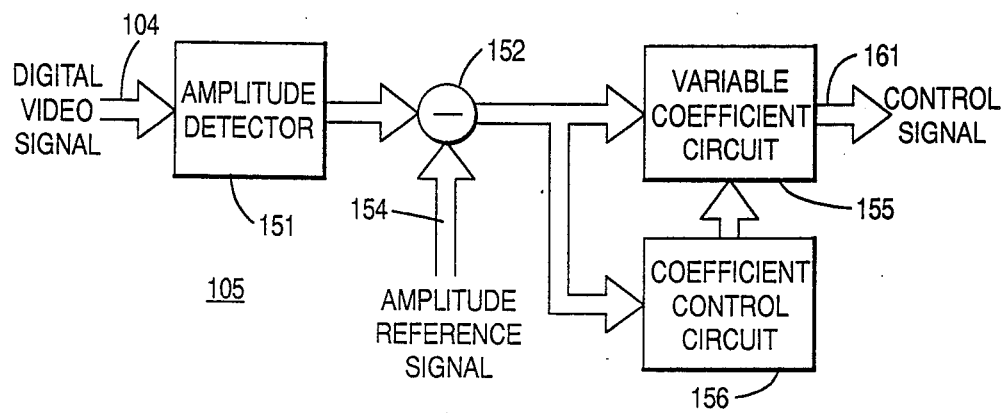
Figure 11:
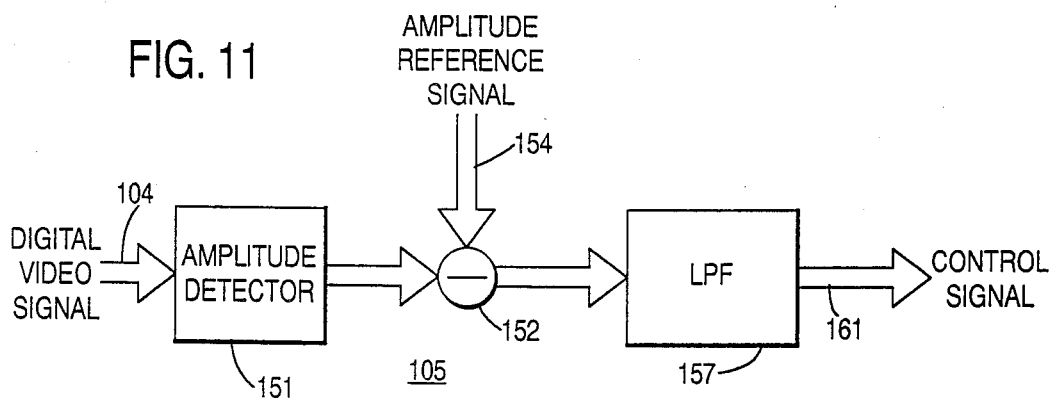
Figure 12:
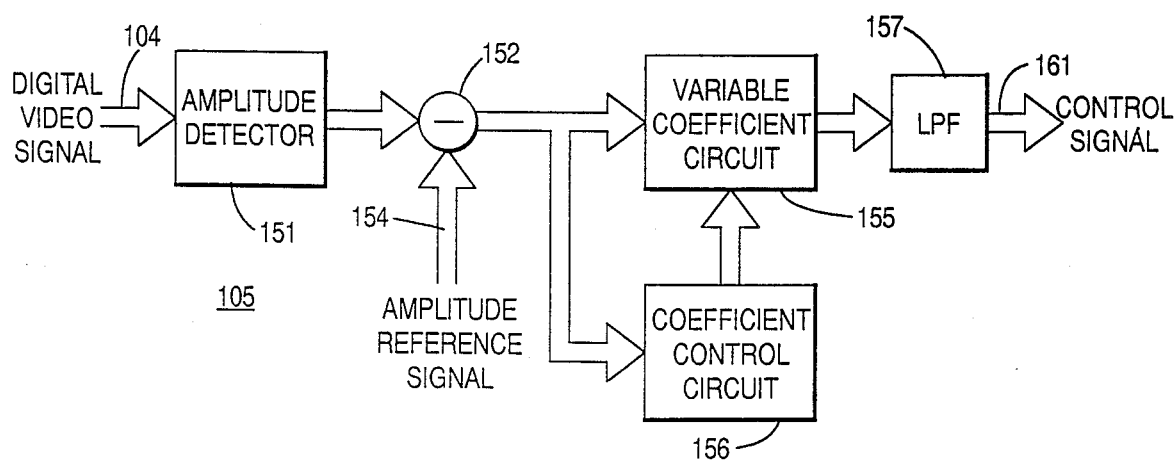

The amplitude error detector 105 having the constitution of FIG. 9 in this embodiment may be so modified as shown in FIG. 10, 11 or 12. The operations of such modifications correspond respectively to those in FIGS. 5, 6 and 7 described in connection with the exemplary constitutions of the DC error control circuit in the aforementioned embodiment of the clamping apparatus, and are therefore inferable with facility. The variable coefficient circuit 155, coefficient control circuit 156 and low-pass filter 157 are the same in structure and operation as those elements 55, 56 and 57, respectively, of the clamping apparatus. That is, if the constitution of the amplitude error detector 105 is so modified, it becomes possible to enhance the stability with respect to any noise and the transition characteristics at the time of switching the signal, and further to compensate for the incompleteness of the integrator 112 to stabilize the amplitude, hence maintaining the amplitude at a predetermined value under control.

It is to be understood that the present invention is not limited merely to the above exemplary embodiments of the clamping apparatus and the gain control apparatus described in relation to video signal, and the invention is applicable also to a variety of signals including audio signal and further to other constitutions and objects as well within the scope defined in the appended claims.

What is claimed is:

1. A clamping apparatus comprising:
analog-digital conversion means for converting an analog signal to a digital signal;
DC error control means for detecting a DC error from the digital signal of said analog-digital conversion means and outputting a control signal corresponding to the detected DC error;
signal conversion means for outputting a high voltage, a low voltage or a high impedance in accordance with said control signal;
integrating means for integrating the output of said signal conversion means; and
voltage adding means for adding a DC voltage to an input analog signal in accordance with an integrated output of said integrating means and thereby producing, from the result of such addition, an analog signal to be inputted to said analog-digital conversion means.

2. An apparatus according to claim 1, wherein said signal conversion means outputs a high voltage or a low voltage in conformity with the sign of said control signal during a period proportional to the absolute value of the amplitude of said control signal, or outputs a high impedance during an other period.

3. An apparatus according to claim 1, wherein said DC error control means comprises: DC error detection means for producing an error signal by detecting the DC error of the output signal of said analog-digital conversion means; and variable coefficient means for multiplying the error signal by a coefficient corresponding to said error signal and thereby producing the control signal.

4. An apparatus according to claim 1, wherein said DC error control means comprises: DC error detection means for producing an error signal by detecting the DC error of the output signal of said analog-digital conversion means; and low-pass filter means for producing the control signal by passing therethrough a low-frequency component of said error signal.

5. An apparatus according to claim 1, wherein said DC error control means comprises DC error detection means for producing an error signal by detecting the DC error of the output signal of said analog-digital conversion means; variable coefficient means for multiplying the error signal by a coefficient corresponding to said error signal; and low-pass filter means for producing the control signal by passing therethrough a low-frequency component of an output of said variable coefficient means.

6. A gain control apparatus comprising:
   analog-digital conversion means for converting an analog signal to a digital signal;
   amplitude error control signal for detecting an amplitude error from the output digital signal of said analog-digital conversion means and outputting a control signal corresponding to the detected amplitude error;
   signal conversion means for outputting a high voltage, a low voltage or a high impedance in accordance with said control signal;
   integrating means for integrating the output of said signal conversion means; and
   variable gain amplifying means for amplifying an input analog signal in accordance with an integrated output of said integrating means and inputting the amplified signal to said analog-digital conversion means.

7. An apparatus according to claim 6, wherein said signal conversion means outputs a high voltage or a low voltage in conformity with the sign of said control signal during a period proportional to the absolute value of the amplitude of said control signal, or outputs a high impedance during any other period.

8. An apparatus according to claim 6, wherein said amplitude error control means comprises: amplitude error detection means for producing an error signal by detecting the amplitude error of the output signal of said analog-digital conversion means; and variable coefficient means for multiplying the error signal by a coefficient corresponding to said error signal and thereby producing the control signal.

9. An apparatus according to claim 6, wherein said amplitude error control means comprises: amplitude error detection means for producing an error signal by detecting the amplitude error of the output signal of said analog-digital conversion means; and low-pass filter means for producing the control signal by passing therethrough a low-frequency component of said error signal.

10. An apparatus according to claim 6, wherein said amplitude error control means comprises: amplitude error detection means for producing an error signal by detecting the amplitude error of the output signal of said analog-digital conversion means; variable coefficient means for multiplying the error signal by a coefficient corresponding to the error signal; and low-pass filter means for producing the control signal by passing therethrough a low-frequency component of an output of said variable coefficient means.

* * * * *